(12) United States Patent
Winger et al.

(10) Patent No.: US 10,928,312 B2
(45) Date of Patent: Feb. 23, 2021

(54) GAS SENSOR MODULE

(71) Applicant: Sensirion AG, Stäfa (CH)

(72) Inventors: Martin Winger, Stäfa (CH);
Christophe Salzmann, Stäfa (CH);
Fabian Weller, Stäfa (CH)

(73) Assignee: SENSIRION AG, Stafa (CH)

( * ) Notice: Subject to any disclaimer, the term of this patent is extended or adjusted under 35 U.S.C. 154(b) by 575 days.

(21) Appl. No.: 15/815,885

(22) Filed: Nov. 17, 2017

(65) Prior Publication Data

US 2018/0143129 A1    May 24, 2018

(30) Foreign Application Priority Data

Nov. 18, 2016  (EP) ..................................... 16199573
Dec. 15, 2016  (EP) ..................................... 16204432

(51) Int. Cl.
*G01N 21/3504* (2014.01)
*H05K 1/18* (2006.01)
*G01N 21/03* (2006.01)
*G01N 21/01* (2006.01)

(52) U.S. Cl.
CPC ..... *G01N 21/3504* (2013.01); *G01N 21/0303* (2013.01); *H05K 1/182* (2013.01); *G01N 2021/0106* (2013.01); *G01N 2201/0636* (2013.01)

(58) Field of Classification Search
CPC . G01N 21/3504; G01N 21/0303; H05K 1/182
USPC ...................................................... 250/343
See application file for complete search history.

(56) References Cited

U.S. PATENT DOCUMENTS

| | | |
|---|---|---|
| 5,599,503 A | 2/1997 | Manz et al. |
| 8,257,655 B2 | 9/2012 | Martin |
| 2007/0114421 A1* | 5/2007 | Maehlich ........... G01N 21/3504 250/343 |
| 2007/0161113 A1* | 7/2007 | Ash ..................... A61M 1/1609 436/113 |
| 2008/0019877 A1* | 1/2008 | Martin ............... G01N 21/3504 422/83 |
| 2009/0039267 A1 | 2/2009 | Arndt et al. |
| 2012/0057161 A1* | 3/2012 | Tkachuk .............. G01N 21/532 356/437 |

(Continued)

FOREIGN PATENT DOCUMENTS

| | | |
|---|---|---|
| DE | 10084211 B4 | 6/2009 |
| WO | WO-2016/129293 A1 | 8/2016 |

OTHER PUBLICATIONS

Extended European Search Report dated Feb. 21, 2017 in European Application No. 16204432.5 (9 pgs.).

(Continued)

*Primary Examiner* — David P Porta
*Assistant Examiner* — Abra S Fein
(74) *Attorney, Agent, or Firm* — Foley & Lardner LLP

(57) ABSTRACT

A gas sensor module integrated onto a board comprising at least one radiation source configured for emitting radiation, at least one radiation detector unit configured to detect at least part of said radiation, and a radiation cell providing at least one radiation path from said radiation source to said radiation detector unit. Said board is provided with a recess and said radiation path is propagating within said recess.

25 Claims, 6 Drawing Sheets

(56) References Cited

U.S. PATENT DOCUMENTS

2013/0021611 A1* 1/2013 Tsurutani ........... G02B 27/1006
356/416
2014/0070101 A1 3/2014 Matsushima et al.
2018/0003622 A1 1/2018 Fujisawa et al.

OTHER PUBLICATIONS

Aronniemi, M. "Optical CO2 module with chip-on-board MEMS components and injection-molded plastic optics." Presentation, Oct. 7, 2013, Semicon® Europa2013, Dresden, Germany (16 pgs.).

Liu, X. et al. "Infrared Spatial and Frequency Selective Metamaterial with Near-Unity Absorbance." Physical Review Letters, vol. 104, May 2010, pp. 207403-1-207403-4.

Liu, X. et al. "Taming the Blackbody with Infrared Metamaterials as Selective Thermal Emitters." Physical Review Letters, vol. 107, Jul. 2011, pp. 045901-1-045901-4.

Sensirion AG, "Environmental Sensing", Environmental Sensors Product Announcement with German-language equivalent, 2018 (16 pgs.).

Office Action dated Jun. 11, 2018 in European Application No. 16204432.5 (5 pgs.).

* cited by examiner

GAS SENSOR MODULE

CROSS REFERENCE TO RELATED APPLICATIONS

This application claims priority to European Application Nos. 16199573.3, filed Nov. 18, 2016, and 16204432.5, filed Dec. 15, 2016; the entire disclosures of both of which are incorporated by reference herein.

TECHNICAL FIELD

The present invention relates to a gas sensor module, in particular to an optical gas sensor module for ascertaining a gas concentration, such as $CO_2$ gas, in a test medium.

PRIOR ART

US 2009/0039267 A1 discloses a gas sensor device for determining a gas concentration. A specifically compact gas sensor design is achieved, according to US 2009/0039267 A1, by using a specific reflector module.

DE 100 84 211 B4 also discloses a gas sensor device. Here, the gas sensor device comprises a light source, a measuring chamber for the medium to be determined, a filter device, and a measuring cell device. The filter device consists of a plurality of filters and the measuring cell device comprises one measuring cell per filter such that the measuring arrangements comprising one measuring cell and one filter have a different spectral sensitivity. It is further taught that a difference of measurement signals is determined by means of further measuring organs.

SUMMARY OF THE INVENTION

It is an object of the present invention to specify a gas sensor module with a more compact design.

This object is achieved by the gas sensor module according to claim 1. According thereto, a gas sensor module is suggested that is integrated onto a printed circuit board (PCB) carrier comprising:

at least one radiation source configured for emitting radiation;

at least one radiation detector unit configured to detect at least part of said radiation;

a radiation cell providing at least one radiation path from said radiation source to said radiation detector unit.

The above stated object is achieved in that said board is provided with a recess and said gas sensor module is configured (i.e. designed) such that at least part of said at least one radiation path is propagating through or into said recess.

In the context of the present invention, the term "board" may refer, for some embodiments, to a circuit board, preferably a printed circuit board or a board onto which circuitry is mounted otherwise, it may refer to a card. The board may be hard or flexible.

In the context of the present invention, the term "recess" may refer, for some embodiments, to a through-opening through the board; for some embodiments, it may be referred to as cut-out. It is also conceivable, however, that the recess is an indentation from one side of the board, i.e. no through-opening. Most preferably, however, the recess is a through-opening extending from a first sided of the board to the second side of the board.

In some embodiments, the at least one radiation path extends into or propagates through the recess while the radiation source and/or the detector unit are arranged outside said recess. In some embodiments, the recess may be shaped to receive at least part of the radiation source and/or the detector unit, preferably also at least part of the radiation detector unit and/or preferably at least part of further preferred building units such as the reflector capsule, radiation filter arrangement and/or other as mentioned below. In some embodiments, the radiation source and/or the detector unit are arranged, at least in part or entirely, in said recess.

Typical dimensions of the recess (in the direction of the board) may be in a range of from 10 millimeters to 100 millimeter. The cut-out may also be larger or smaller, depending on the dedicated use of the module.

In the context of the present invention, the term "radiation source" may be a single source, or a plurality of radiation sources, e.g. a chain or cluster of identical or different radiation sources. The radiation source may be a narrowband source, like a laser, or a broadband source like a light bulb, e.g. an incandescent light bulb. Preferred is an infrared source for ascertaining a $CO_2$ gas concentration present in the radiation cell.

In the context of the present invention, the term "radiation cell" is to be understood as measuring space or chamber for the test medium, the test medium being, for example, a gas mixture containing the gas to be measured, such as, for example, $CO_2$ gas, present in the test medium in a certain concentration. The gas sensor module is designed such that the radiation path is guided through the test medium in order to ensure that absorption and emission effects detectable by the radiation detector unit occur. The term "radiation cell" may also refer to an optical cell. In other words, the radiation cell is the space that comprises the radiation paths.

Preferably, boundary surfaces defining said radiation cell are at least in part reflective for at least part of the radiation emitted by the radiation source and received by the detector unit such as to intensify the incident intensity of radiation received by the radiation detector unit. In this case, the sensitivity of the gas sensor module is increased.

The invention is therefore based on the realization that the board may be recessed and the extra space produced through the recess is used as a space for at least part of the at least one radiation path, i.e. it is part of the radiation cell. Preferably, said extra recess space may further be used to accommodate building parts of the gas sensor module, at least partly or entirely. In effect, this arrangement decreases an overall height of the gas sensor module, i.e. it makes possible a particularly compact design. In other words, the overall thickness of the assembled gas sensor module is decreased.

The radiation source and/or the detector unit may be arranged in said recess by placing them on the lateral edge face delimiting the recess or by placing them on the bottom of the recess. The edge face may also be provided with one or more steps on which the radiation source and/or the detector unit may be arranged. The radiation source and/or the detector unit may also be attached to the first and/or second side of the board and extend into the recess, i.e. into the space delimited by planes including the first and the second side of the board, respectively and by the edge face.

In some embodiments, the radiation source and/or the detector unit may be arranged on the first and/or second side of the board in such a manner that they extend beyond the edge face over the recess. This mount may be referred to as "overhanging" mount, see below. Thereby, radiation may be emitted or received in or from both directions normal to the first and second side of the board, respectively.

In some embodiments, said board has a first side and a second side, wherein said radiation source and said at least one detector unit are arranged on the same side of said first and second sides or are arranged on opposing sides of said first and second sides of the board. If said radiation source and said at least one detector unit are arranged on the same side, the radiation entering into the recess (i.e. when part of the at least one radiation paths extends into or propagates through said recess), this very radiation may then be reflected back by an appropriately arranged reflector toward the detector unit. Such a reflector may, for example, be the inner surface of part of the radiation capsule arranged in the recess or on the other side of the board with respect to the radiation source.

The radiation source and/or the detector unit may be arranged on the same side of the recess and on the same or on opposite sides of the board.

Preferably, however, the radiation source and/or the detector unit are arranged on opposing sides of the recess, i.e. they are spaced preferably diametrically across the clearance of the recess in the direction of the first and/or second side of the board.

In some embodiments, said radiation source and/or said at least one detector unit is/are arranged, at least in part or entirely, within said recess. These are particularly preferred embodiments as the embedding of said building parts in said recess allows for a further improved compactness of the gas sensor module. In some embodiments, the radiation source may be arranged on the first side of the board while the at least one detector unit is arranged on the second side of the board, the second side opposing the first side of the board. Accordingly, the recess may then be a trough-opening and the radiation is guided through the recess from the source to the detector, either directly or by one or more reflections, the reflections occurring, for example, at the radiation capsule.

It is also conceivable, to arrange both the radiation source and the detector unit on the same side of the board. In this case, the module is designed such that at least one radiation path propagates in the recess, is back-reflected with one or more reflections to the detector unit.

Furthermore, it is conceivable that the radiation source and/or the detector unit is/are arranged on both sides of the board, which further increases efficiency of the module. In some embodiments, said radiation cell is delimited by a radiation capsule, wherein said radiation capsule encapsulates said the radiation paths, and wherein said radiation capsule is preferably configured to reflect, preferably with at least part, preferably the entire, of its inner surface, at least part of said detectable radiation toward said at least one radiation detector unit. The radiation capsule may be an optical capsule. It may accommodate the radiation source, the radiation detector unit, and/or the radiation filter arrangement, if any.

In some embodiments, said radiation capsule is formed by one or more first and one or more second shells. This modular design allows for a cost-efficient production and assembly of a reliably product.

In some embodiments, the first and second shells provide said inner surface, wherein said inner surface delimits, at least in part, said radiation cell. The radiation cell then forms a containment for the sensitive sensor parts, which protects from mechanical damage and from environment conditions. Importantly, the radiation cell may shield from stray radiation to which the detector unit may be sensitive. Moreover, the inner surface of the radiation cell may be designed to be reflective, such as to produce mirrors for the radiation, whereby an efficiency and sensitivity of the gas sensor module may be further enhanced as the reflections allow for an increase of the number of possible radiation paths and also for a lengthening of an average radiation path, i.e. the absorption path is increased, whereby the absorption effects are increased which results in a stronger sensor signal. Moreover, if the radiation source is placed into the board plane, radiation paths outside the board plane, to both sides, become available by said reflections.

Accordingly, the radiation cell may be designed to focus the radiation output of the radiant source onto the radiation detector unit.

In some embodiments, said radiation capsule is formed by a single first shell and a single second shell, wherein said single first and second shells are designed to have a mirror-inverted design. This allows for a particularly efficient production and robust assembly process.

In some embodiments, said first and second shells are made from metal or comprise at least in part metallized inner surfaces. Thereby, the reflective inner surface may be provided.

In some embodiments, said first and second shells are made from plastic, preferably by moulding techniques, and are coated with a metallic coating on said inner surface, in particular for maximizing infrared reflectivity.

In some embodiments, said radiation capsule is at least partly immersed into said recess. Said recess may preferably a through-opening through or a cut-out of the board, the through-opening enclosing the radiation capsule. In other words, the recess may accommodate the radiation capsule such that the radiation capsule in mounted on the board. Immersing the radiation capsule into the recess allows for realizing a reduction in the overall height of the gas sensor module.

The radiation source and the radiation detector unit may also be arranged on opposite sides of the board, on the same side of the recess (i.e. on directly opposing sites across the board). In this case, the recess may be a slot-like, wherein said slot partly encircles said radiation source and said radiation detector unit. Preferably, said radiation capsule may then extend through said slot such as to enable radiation paths from the radiation source to the detector unit by reflection along the slot.

In some embodiments, said board has a first side and a second side, wherein said radiation cell is designed and said at least one radiation source and said at least one radiation detector unit are configured and arranged such as to establish at least one radiation path on said first and second sides of the board, i.e. on both sides of the board, whereby radiation emitted by said at least one radiation source is detectable from both first and second sides of the board.

Preferably, the board is disposed between the first and second shells. In some preferred embodiments, the first and second shells comprise a fastening structure for fastening them to one another. Preferably, said fastening structure is configured to produce a well-defined arrangement of the first and second shells with respect to one another and irrespective of thickness variations of the board. Thereby the geometry of the radiation cell does not depend on the thickness (or variations thereof) of the board which is beneficial for the optical alignment; in other words: the capsule features a thickness tolerance.

In some embodiments, the first and second shells create, when assembled, slots for receiving the board.

Particularly preferred are embodiments in which the first shell(s) provide(s) a first surface and the second shell(s) provide(s) a second surface, wherein the first and second surfaces define, as top and bottom surfaces, respectively, the width of the slot in the direction of the thickness of the board. In order to further improve stability of the connection between capsule and board, the board may be attached to either the first or second surface of the first and second shells, respectively. This may be done by a material-fit connection such as gluing or soldering or by screwing or other connection techniques. This collection of the board to the top or at the bottom surface is particularly advantageous if the bolt or recess has, in vertical direction, an extension that is larger than the thickness of the board.

To give an example: If the capsule consists of a first and second half shell, i.e. a bottom part and a cover part, the bottom and the top parts may be fastened to one another such that a slot is created extending circumferentially around the capsule. The slot may then be wide enough to accommodate a board with any typical thickness variation, whilst this PCB is additionally attached, e.g. glued, to either the top or the bottom part. Thereby, a well-defined capsule is created and it is possible to accommodate a board with thickness variations.

In some embodiments, said at least one radiation source is a light source, in particular a broadband light source or and infrared light source, such as an incandescent light bulb, preferably a LED, a MEMS hotplate, or a laser or combinations thereof.

In some preferred embodiments, a MEMS hotplate is used as radiation source. The use of this radiation source allows realizing a particularly flat design of the gas sensor module.

Preferably, the lateral edge region of the recess may be provided with a step such that the MEMS hotplate may be conveniently placed in the recess. Furthermore it may be advantageous to design the step such that the capsule may be formed by plate-like shells that are placed onto the step. Thereby, the overall height of the device is further decreased. In this context, the step may be extending circumferentially around the recess or it may be provided only on two opposing sides of the recess. The plate-like shells are then placed over the recess such that the radiation cell is formed by the two plates and the lateral face of the recess, the latter being part of the board.

It is, however, also conceivable, that the MEMS hotplate is arranged on the lateral face delimiting the recess.

Alternatively, the MEMS hotplate may be arranged on the capsule enclosing the recess, for example on a protrusion protruding into towards the recess, wherein the arrangement is chosen in such a manner that the MEMS hotplate is at least partly protruding into the recess.

In some embodiments, said at least one radiation source is mounted in a holder. This holder may be provided on the board or on the radiation shell. Alternatively or additionally, the radiation source (and also the filter plates as taught below) may be fastened by clamping, by gluing, by soldering or by thermoplastic staking or similar techniques.

In some embodiments, a radiation filter arrangement is placed in one or more of said at least one radiation path leading to the respective detector unit. This radiation filter element may comprise one of more filter plates. Such filter plates may be inserted into grooves or slots, i.e. into filter holder for positive locking and/or force-fit fastening of the filter element. The grooves or slots are preferably provided by or on the board or, more preferably, by on the radiation cell itself.

Preferably, the filter plane is oriented at substantially right angles to the connecting line connecting the corresponding radiation source and the detector associated with the filter plate.

In some embodiments, said radiation filter arrangement and the at least one detector unit associated to one another are separate units, i.e. individual units, that are spaced apart by at least 1 millimeter to 10 millimeters. Thereby, the optical system may be optimized for both for a narrow angle distribution incident on the filter and for efficient detection of the radiation in the detector plane. In other words, the embodiments that allow for placing the filter element at an arbitrary location in the radiation cell grant a high degree of design freedom regarding angular distribution and absorbed radiation power as the radiation path before and after the filter element can be optimized independently.

In some embodiments, the at least one radiation detector unit is a broadband detector unit. In this case, it is preferred that the radiation filter arrangement is a narrowband filter arrangement. Thereby, only the spectral density relevant for the detection of the gas is sensed by the detector while the other spectral density is shielded from the detector by the filter. It is also conceivable, that the detector unit is a narrowband detector and the radiation is broadband radiation; in this case, in some embodiments, the radiation filter arrangement may be dispensed with.

In some embodiments, said radiation filter arrangement is designed to have a filter plane and the at least one detector unit is designed to have a detector plane, wherein said radiation filter arrangement and the at least one detector unit associated to one another are disposed such that the filter plane and the detector plane are at substantially right angles to one another.

In particular thermal infrared detectors are subject to spurious thermal signals that arise from heat conduction between heat-absorbing bodies close to the detector membrane (e.g. infrared filter plates in conventional infrared thermopile detectors). By placing the infrared filters at a substantially 90° angle with respect to one another and preferably several millimeters apart from one another, the impact of such a spurious thermal coupling may be decreased.

In some embodiments, no radiation filter arrangement as described herein is arranged in said at least one radiation path. This allows for a particularly simple and robust design at low production costs. In this case, radiation from the radiation source may be shed directly or indirectly via the reflective radiation capsule, if any, onto the radiation detector unit.

Some preferred embodiments comprise a detector unit with two or more detectors. The single detectors may be arranged in a spaced manner to one another. Accordingly, a plurality of radiation channels may be created connecting the at least one radiation source and the corresponding detector. Thereby, a multi radiation channel gas sensor module is specified. The radiation capsule, if any, may be shaped to provide as a casing tube-like structures for each channel and fastening structures for fasting filter elements, if any.

In some embodiments, said radiation channels are disposed such as to extend generally radially outwardly from the same at least one radiation source. They may also be disposed parallel to one another or along opposing direction.

In some preferred embodiments, the radiation filter arrangement comprises a filter element in at least one, preferably in each radiation channel. Preferably, the filter elements are of plate-like design, wherein the plates are arranged substantially on a virtual circle with the radiation source at the center.

In some embodiments, at least one of said radiation channels is configured as a reference radiation channel. This may be achieved by arranging a specific detector or a specific filter-detector pair in the reference channel that is sensitive to reference radiation that is transmitted along the reference channel. Here, the reference radiation has a different interaction scheme with the gas to be measured; preferably, the reference radiation does not interact significantly with the gas to be measured.

It may also be conceivable that the reference channel is not filled with the gas to be measured.

In some embodiments, the reference channel is used in order to recalibrate the gas sensor module upon alteration of the radiation source. Such alteration may occur in time because the radiation source, for example a lightbulb, degenerates, whereby its radiation characteristics changes. In order to compensate this degeneration effect, measurement results obtained by use of reference channel may be used.

In some embodiments, said radiation capsule is provided with at least one or more access openings that act as pass-through for gas such as to allow gas exchange with the environment of the radiation cell or the module. Such access openings are preferably arranged in the region of the radiation source away from the at least one radiation detector unit.

The access openings may be covered, at least in part, by a venting medium, wherein preferably, all access openings are completely covered by the venting medium. The venting medium acts as a filter medium avoiding that dust particles and/or water enters the radiation cell. A typical venting medium may be a membrane or the like that spans at least part of at least one access opening.

In some embodiments, the detector unit may comprise one or more thermal infrared detectors integrated in a CMOS framework.

The infrared sensor chips may then be mounted on the board in an overhanging manner: The chip is fastened, e.g. bonded, to the board, for example, on the (mechanically solid) ASIC part. The infrared-sensitive region protrudes over an internal edge of the board into the recess such a way that the membrane can be optically accessed from the top and the bottom. This dual-side illumination allows increasing the sensitivity.

In some embodiments the detector unit that may comprise several detectors, may be integrated onto one single chip. The single chip may, but doesn't have to, be provided with ASIC components. Such ASIC components may preferably be arranged between the sensitive region of the detector that is provided on the single chip, i.e. in the middle region of the chip. Alternatively, the sensitive regions of the detectors may be arranged in a front region of the chip while the ASIC components are arranged in a rear region of the chip. Such a design is advantageous as the region with ASIC components is mechanically more stable and therefore suited for attachment of detector parts in an overhanging arrangement as described herein.

In other embodiments, each detector may be integrated onto an individual chip, in other words, the detectors are provided separate chips, with all without ASIC components.

In some embodiments, an infrared detector may be used that comprises an absorber layer, such as a membrane, which is connected to temperature sensors, such as thermocouples or the like. Radiation impact on to the absorber layer may be sensed by means of the temperature sensors, wherein the rising temperature is a measure for the infrared radiation received.

In some embodiments, a resistive wire may be integrated into the infrared detector instead of or in addition to the thermocouples.

In some embodiments, the radiation filter function may be integrated into the detector unit and/or into the radiation source. This integrated filter function may be provided alternatively or additionally to the separate radiation filter arrangement as described herein.

In some embodiments, the detector unit may include metamaterial perfect absorbers (MPAs) as described, for example, in Liu et al., Infrared Spatial and Frequency Selective Metamaterial with Near-Unity Absorbance, in PRL 104, 207403 (2010). These MPAs may be integrated to the detector unit to act as the only or as an additional filter element to the individual radiation filter arrangement as described herein. Additionally or alternatively, such MPAs may also be integrated onto the radiation source, i.e. the radiation emitter, as taught, for example, Liu et al., Taming the Blackbody with Infrared Metamaterials as Selective Thermal Emitters, in PRL 107, 045901 (2011).

Alternatively or additionally to said individual radiation filter arrangement and/or said integrated filter elements, the filter elements as described in DE 100 84 211 B4 may be used to achieve the filter function.

In some preferred embodiments, the gas sensor module is configured for ascertaining a gas concentration, preferably a $CO_2$ gas concentration, in a test medium. Particularly preferred is a two-channel $CO_2$ ascertaining gas sensor module, wherein one radiation channel is irradiated with electromagnetic radiation with a wavelength in the range of from 4.1 micrometers to 4.5 micrometers, preferably of 4.3 micrometers. This radiation is substantially within the absorption band of $CO_2$ gas. The other channel may be supplied with electromagnetic radiation substantially outside the absorption band of $CO_2$ gas, for example, with electromagnetic radiation with a wavelength of, for example, 3.9 micrometers. Accordingly, there is provided a module with a $CO_2$ channel and a reference channel.

In some embodiments, the first and second shells are connected to one another by means of staking, in particular by ultrasonic staking. It is particularly preferred to firstly connect the first shell and the board to one another, preferably by staking, in particular ultrasonic staking, and then, secondly, to connect the second shell to the first shell, preferably by staking, in particular by ultrasonic staking. In some embodiments, the board is not directly connected to the second shell but via the first shell.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

A preferred embodiment of the present invention is now described with reference to FIGS. 1 to 4. The figures show proportionally exact illustrations of preferred embodiments, i.e. said drawings show the subject matter in such a manner that relative proportions may be read from the drawings.

In the context of the figures, a gas sensor module for ascertaining a $CO_2$ gas concentration in test gas is exemplarily described, wherein infrared light is used a radiation. Accordingly, detection of electromagnetic radiation with a wavelength of 4.3 micrometers to provide the $CO_2$ channel $C_1$ and detection of electromagnetic radiation with a wavelength of 3.9 micrometers for a reference channel $C_2$ is used. It is to be understood that different radiation and detector and filter setups may also be used for different application without departing from the concept of the present invention.

Figure 1:
FIG. 1 shows, in a perspective top view, an embodiment of the first shell.

FIG. 1 shows, in a perspective top view, an embodiment of a first shell 51 of a radiation capsule 50.

Figure 3:
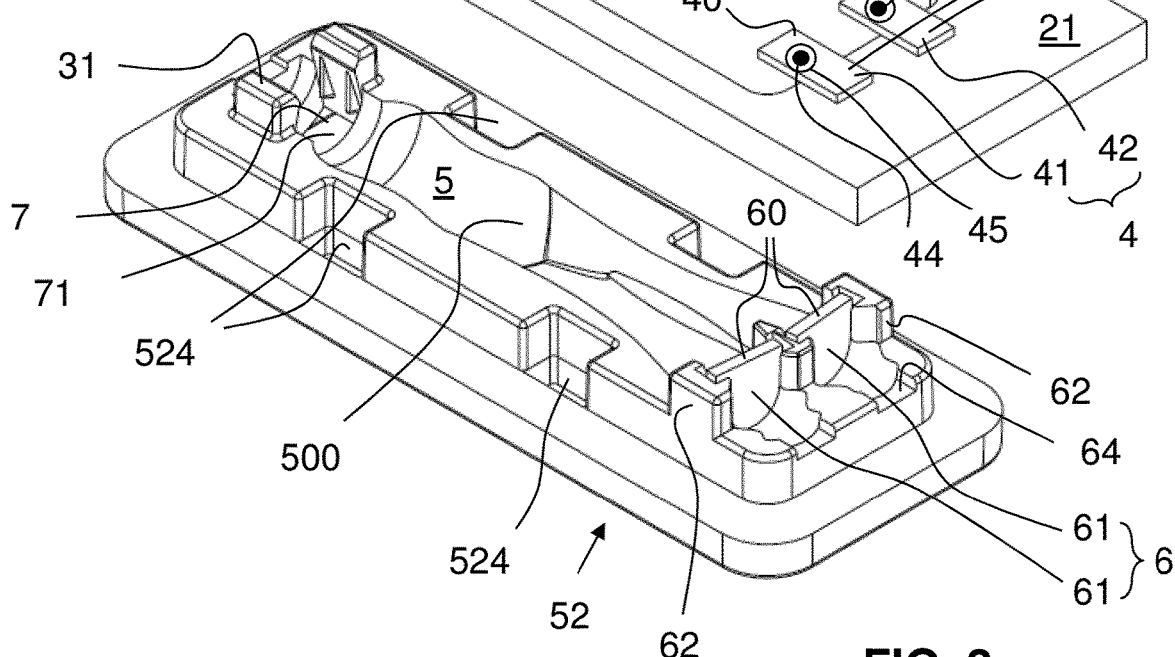
FIG. 3 shows, in a perspective top view, an embodiment of the second shell.

FIG. 3 shows, in a perspective top view, an embodiment of a second shell 52 of a radiation capsule 50. The first and second shells 51, 52 are half shell constituents of the radiation capsule 50 that cooperate with one another such as to form a capsule, i.e. a hollow body, wherein the radiation cell 5 is the interior space of the hollow body. The radiation cell 5 is formed by the radiation source chamber 3 and the radiation channels $C_1$ and $C_2$ (cf. below and FIG. 4).

Figure 2:
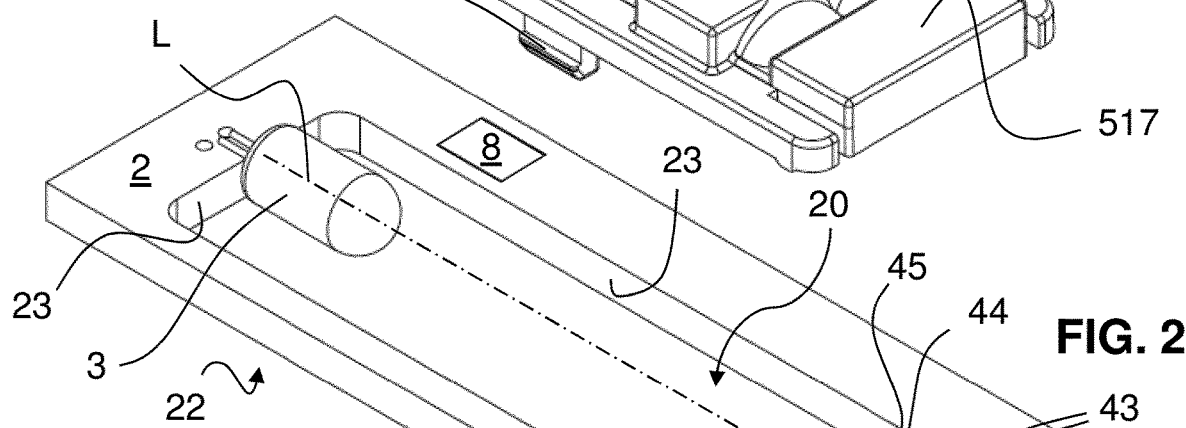
FIG. 2 shows, in a perspective top view, an embodiment of the board with a central recess.

FIG. 2 shows an embodiment of the board 2, which preferably is a printed circuit board, having a first side 21 (top side in the figures) and a second side 22 (bottom side, opposite the top side, in the figures).

Figure 4:
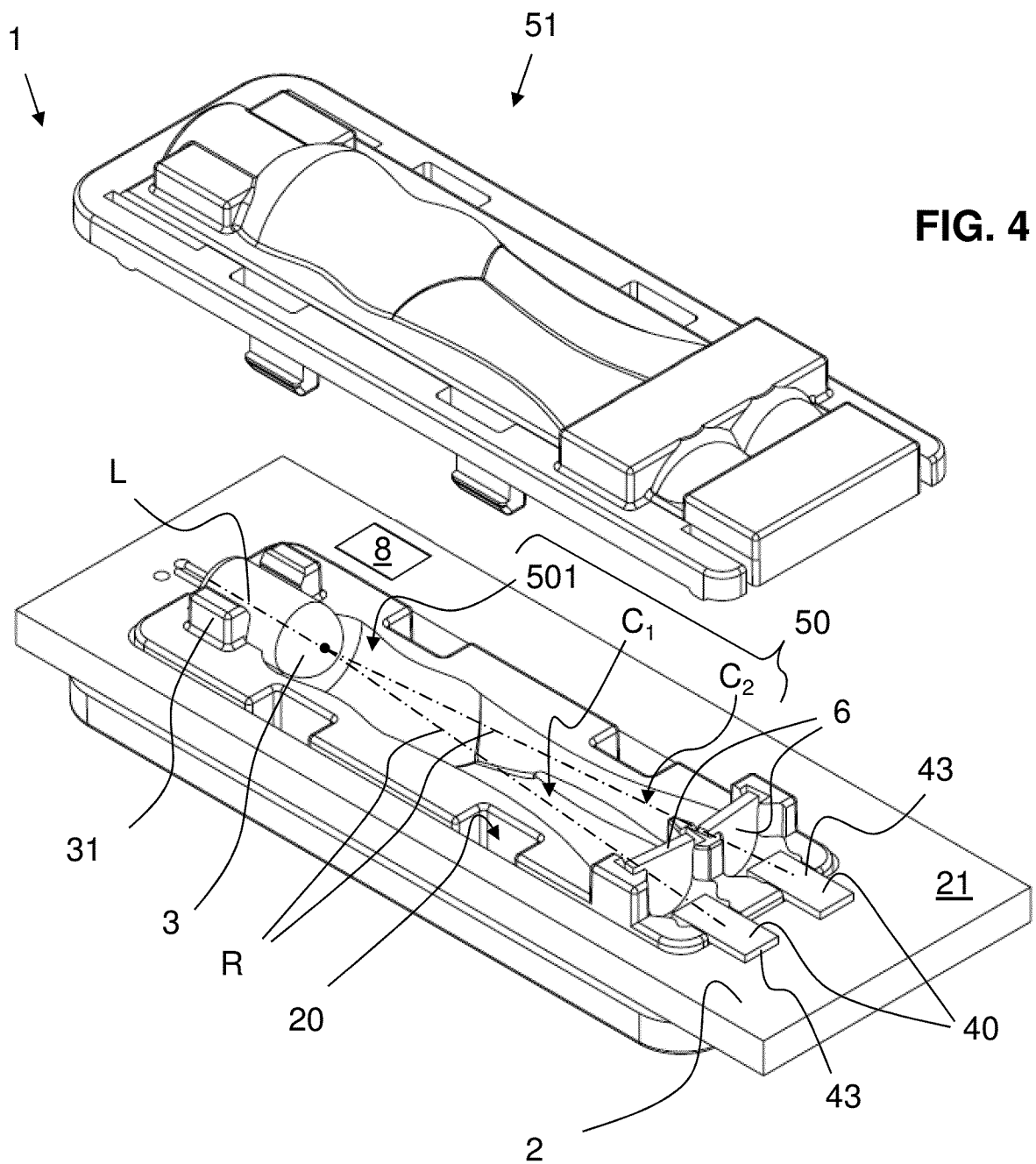
FIG. 4 shows, in an exploded perspective top view, of partly assembled gas sensor module with the first and second shells and the board according to FIGS. 1 to 3.

FIG. 4 shows the gas sensor module in a partly assembled state, more precisely, the first half shell 51 is disengaged from the rest of the module 1.

As can be seen from the figures, the board 2 is a substantially flat plate with a substantially rectangular cutout or through-hole in the center and is referred to, in the context of the present description, as recess 20. The recess 20 has rounded corner regions. The recess 20 extends from the first side 21 to the second side 22 of the board 2, and is shaped to conveniently accommodate the radiation capsule 50. More specifically, the board 2 encloses, with lateral inner face 23 delimiting the recess 20, said radiation capsule 50 circumferentially.

The first shell 51 comprises a first containment part 515 (cf. left in FIG. 1) for receiving a source holder 31 arranged on the second shell 52 (cf. below and left in FIG. 3) and, furthermore, for receiving connecting parts of the radiation source 3. A second containment part 511 is adjoining the first containment part 515. The second containment part 511 delimits the radiation source chamber 501. Third and fourth containment parts 512, 513 are adjoining the second containment part 511; the third and fourth containment parts 512, 513 are delimiting a half tube-like casings the first and second radiation channel $C_1$ and $C_2$, respectively. A fifth containment part 516 joins the third and fourth containment parts 512, 513. The fifth containment part 516 receives filter holders 62 (cf. below and FIG. 3). Finally, a sixth containment part 517 is disposed on the right side of the first shell 51 as seen in FIG. 1. The sixth containment part 517 receives parts of the sensor chips 43 (cf, for example, FIG. 2).

The second half shell 52 provides opposing structures for cooperation with the containment parts 511 to 513 and 516, 517 such that the radiation cell 5 is completed from the bottom side, i.e. from side 22 of the board 2.

The first and second half shells 51, 52 cooperate with one another by means of a snap-in fastening structure that comprises snap-in hooks 514 and snap-in recesses 524. The snap-in connection 514, 524 may be designed in a releasable manner. As can be seen from the figures, the snap-in hooks 514 extend through the recess 20 from the first side 21 to the second side 22. When fastened to one another, the two half shells 51, 52 provide a circumferentially extending slot (oriented horizontally in the figures), which is dimensioned and shaped to receive the lateral inner edge region of the board 2 that provides said lateral inner face 23 delimiting the recess 20.

In some embodiments, this circumferential slot has a width (a vertical clearance in the figures) that is suitable for clamping said board inner edge region with a suitable clamping force.

Preferably, the width of said circumferential slot (i.e. said vertical clearance in the figures) is large enough to account for variations in the thickness of the board 2. It is particularly preferred that the assembling procedure is such that the board 2 is attached, preferably in a material-fit manner, e.g. by gluing, soldering, staking (ultrasonic or thermoplastic or other) . . . , to only one half shell 51 or 52 while the fasting structure (such as the snap-in hooks and recesses 514, 524) is adapted to fasten the first and second shell 51, 52 in a well-defined manner with respect to one another. Thereby, thickness variations in the board 2 do not influence the geometry of the radiation cell 5 defined by the shells 51, 52. This is particularly advantageous as the geometry of the radiation cell is typically adjusted to the radiation used.

Other connections in a material-fit manner, such as gluing, may be used. Thereby, the radiation capsule 50 is fastened to the board 2 in a positive-locking and form-fit manner, and, if desired, in an additional material-fit manner.

In a preferred embodiment, the first and second shells 51, 52 are connected to one another by means of staking, in particular by ultrasonic staking. It is particularly preferred to firstly connect the first shell 51 and the board 2 to one another, preferably by staking, in particular ultrasonic staking, and then, secondly, to connect the second shell 52 to the first shell 51, preferably by staking, in particular by ultrasonic staking.

The radiation capsule 50, i.e. the first and second shells 51, 52, is a moulded piece from plastic which is metalized for reflectivity on its inner surface 500, the inner surface 500 delimiting the radiation cell 5. The radiation cell 5 comprises a radiation source chamber 501 in which the radiation source 3 is arranged and the radiation channels $C_1$ and $C_2$.

Access openings 7 are provided that extends from the outside into the radiation cell 5 such that a gas exchange is possible between the environment and the radiation cell 5. The access opening 7 is arranged away from the detector unit 4 and close to the radiation source 3. The access opening 7 is covered by a venting medium 71. The venting medium 71 may be a membrane that protects the radiation cell 5 from dust particles and water.

During measurement, the gas in the radiation cell 5 is measured.

Said radiation source 3 is, in this embodiment, a broadband incandescent light bulb. The source 3 is arranged in a source holder 31. The source holder 31 cooperates with the first containment part 515 such as to properly fasten the radiation source 3 in the radiation capsule 50. As can be seen from the figures, the source is oriented such that its length axis L is disposed in the recess 20, more specifically within the plane of the board 2 (cf. FIG. 2) and attached to one of the short faces of the rectangular recess 20 (the left one in FIG. 2).

The first and second radiation channels $C_1$ and $C_2$ extend from the radiation source chamber 501, or more precisely: from its end region opposite of the radiation source 3. The radiation channels $C_1$ and $C_2$ define the general direction of the radiation paths X, wherein a first set of radiation paths X is propagating, after exiting the radiation source chamber 501, generally along the first radiation channel $C_1$ and a second set of radiation paths X is propagating, after exiting the radiation source chamber 501, generally along the second radiation channel $C_2$. These sets of radiation paths X include direct radiation paths X from the source 3 through filter elements 61 to the detector unit 4 as well as indirect radiation paths X. Indirect radiation paths X include at least one or more, often significantly more than one, reflection at the inner surface 500. This provision is advantageous as it lengthens the absorption path and therefore the sensitivity of the module 1. In FIG. 4 direct radiation paths X from the light source 3 to the infrared sensor chips 43 in both channels $C_1$ and $C_2$ are shown.

Accordingly, the inner surface 500 may be reflective for the radiation that interacts with the gas to be measured and it may be shaped such that the radiation power output of the source 3 is properly guided and focussed onto the filter and detector arrangement. The reflectivity may be achieved in that the plastic half shells 51, 52 are metallized on their inner surfaces. Of course this inner reflective coating depends on the radiation used and may therefore be different in different embodiments. The radiation capsule 50, which is generally an optional feature, provides therefore not only the advantages of protecting sensitive parts arranged within the capsule from mechanical damage and from environmental influences, it may also act as focussing element for guiding appropriate amounts of radiation through the gas detector module 1. It may help to split the radiation efficiently into the different radiation channels $C_1$ and $C_2$.

The first and second radiation channels $C_1$ and $C_2$ are oriented such that their longitudinal axes extend radially outwardly from the same radiation source 3. In other words, the longitudinal axes extend angular with respect to one another and meet generally in the region of the radiation source 3 (cf. FIG. 4). Alternatively, these longitudinal axes may be parallel to one another and/or they may be supplied by different radiation sources, the latter may emit the same or different radiation.

A radiation filter arrangement 6 is disposed at distal ends of the radiation channels $C_1$ and $C_2$ (i.e. opposite of the radiation source end of the channels). The radiation filter arrangement 6 comprises two filter plates 61 that each define a filter plane 60 and that are arranged in filter holders 62 on the second shell 52. Generally, there is one filter plate 61 per detector 41, 42. Of course there could be more or less the numbers of either building part. The filter plates 61 are narrowband filters allow transmission of radiation within a wavelength range selected according to the gas to be measured while they block transmission in other wavelength ranges. The filter pass band may also be selected to transmit only light that is not coupled to any atmospheric gas to implement a reference channels. The filter plates may be implemented as interference coatings on an optical substrate. The filter holders 62 cooperate with the fifth containment part 516 such as to properly fasten the filter plates 61.

The filter plates 61 in the filter holder 62 are oriented such that they are disposed on a circle extending through the filter plane center and having the radiation source 3 as center point. In other words, the filter plates 61 associated with the first and second channels $C_1$ and $C_2$, respectively, are disposed in an angular manner with respect to one another and substantially at right angles with respect to the longitudinal axis of the first and second radiation channels $C_1$ and $C_2$.

As can be seen from FIG. 3 (and FIG. 4), the second shell 52 has, at its sensor end (that is to the right to the figures) two recesses 64 for receiving the sensor chips 43 (cf. below).

Behind the filter elements 61 is arranged the radiation detector unit 4 with two individual detectors, i.e. a first and second thermal infrared detectors 41 and 42. Both detectors 41, 42 are provided on a sensor chip 43. The sensor chips 43 both comprise a mechanically stable ASIC end region and a sensor end region. The sensor chips 43 are fastened, with their rigid ASIC end regions to the edge region of the board 2; accordingly, the sensor chips 43 extend substantially parallel to the board plane. The sensor end regions of the sensor chips 43 then protrude, as free ends, over the lateral inner face 23 of the board 2 into the radiation cell 5.

In the sensor region of each sensor chip 43, i.e. in the overhanging section of the chip 43, is arranged a conventional thermal infrared sensor 44 that is suspended on a membrane 45, the latter spanning a through-opening through the substrate of the sensor chip 43. This design allows that radiation incident from both sides, i.e. the top side (or in this embodiment the first side 21 of the board 2) and the opposing bottom side may be measured by the same sensor chip 43. This accessibility of the detector unit 4 from both sides, the dual-side illumination feature, is advantageous, as it allows that radiation paths X propagating on the first side 21 and/or on the second side 22 of the board 2 may be used. Therefore, the available space is more efficiently used which enhances the compactness of the module 1.

In some embodiments (not shown), the sensor chips 43 may be disposed in recesses in the board 2 or they may be shaped in a manner such as to bring the sensor end region into or close to the middle plane of the recess 20 (in vertical direction).

Both sides 21, 22 of the board 2 are readily accessible to the radiation source 3 as it is located, in this embodiment, in the recess 20, more precisely: It is arranged with its longitudinal axis L in the middle plane of the board 2.

As can be seen from the figures, the first and second radiation channels $C_1$ and $C_2$ extend, in the direction perpendicular to their longitudinal direction, i.e. in transverse direction, to both sides 21, 22. Accordingly, the overhanging design of the sensor chip mount and the arrangement of the radiation source 3 in a through-opening in the carrier 2 allow further increasing efficiency of the gas detector module 1. It allows further reducing the overall height of the module 1 and therefore further increases compactness of the module 1.

As can be seen from the bottom part of FIG. 4, the filter plane 60, as defined by the filter plate 61, is oriented at right angles to the detector plane 40 of the respective detector 41, 42. This is advantageous as thermal effects may be decreased. More specifically, the thermal infrared detectors 44 are subject to spurious thermal signals that arise from heat conduction between heat-absorbing bodies close to the detector membrane 45 (e.g. infrared filter plates 61 in conventional infrared thermopile detectors 44, 45). By placing the infrared filters 61 at right angles relative to the detector plane 60 and at the distance of several millimeters away from the detectors 41, 42, respectively, the impact of such spurious thermal coupling is decreased.

Alternative designs of the detector unit 4 may be used. It is advantageous, but not necessary, that the detector plane is disposed vertically to the filter plane. Also the above described dual-side illumination feature of the detector unit 4 is advantageous but not necessary.

The first and second channels $C_1$ and $C_2$, including the radiation source chamber 501, are shaped such that a maximum radiant output of the radiation source 3 is guided to the respective detector 41, 42, respectively.

Furthermore, the gas sensor module 1 includes a microprocessor 8 for controlling the different electronic parts, in particular the radiation source 3 and the detector unit 4.

A typical length of the capsule 50 according to FIGS. 1 to 4 may be in a range of from 10 millimeters to 100 millimeters, preferably in a range of from 10 millimeters to 50 millimeters; a typical with of the capsule 50 may be in a range of from 5 millimeters to 50 millimeters, preferably in a range of from 5 millimeters to 15 millimeters. A typical height of the capsule 50 may be equal to or less than 20 millimeters, preferably equal to or less than 10 millimeters.

Figure 5:
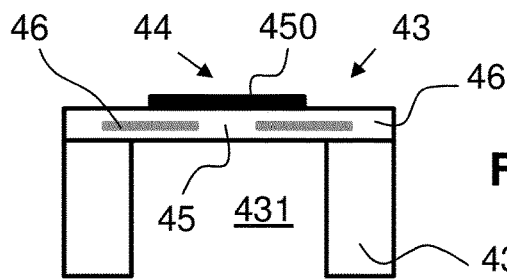
FIG. 5 shows a schematic cross-sectional view of an embodiment of a detector chip.

FIG. 5 shows a further embodiment of the sensor chip 43. In this case, the sensor chip 43 is an infrared sensor chip. The sensor chip 43 is provided with a silicon substrate 430 that includes an opening 431 and that defines the detector plane 40 (see FIG. 6). The opening 431 is spanned with a membrane 45. Thermocouples 46 are arranged in the edge regions of the substrate 430 delimiting the opening 431 in order to measure any change in temperature due to absorbance of infrared radiation on the absorber layer 450 disposed on the membrane 45.

Figure 6:
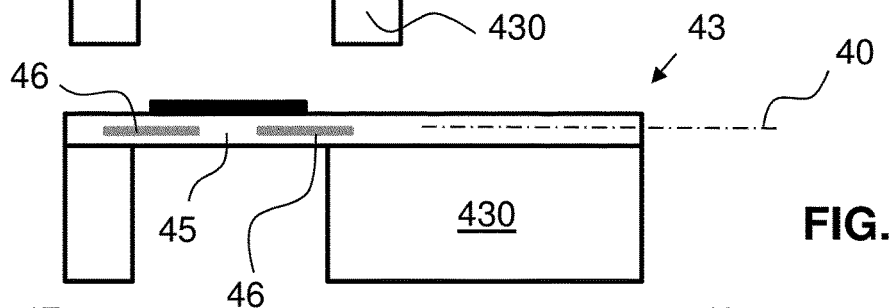
FIG. 6 shows a schematic cross-sectional view of an embodiment of another detector chip.

FIG. 6 shows a further embodiment of the sensor chip 43, substantially similar to the embodiment according to FIG. 5, but further including, on the right side, mechanically stable ASIC region.

Figure 7:
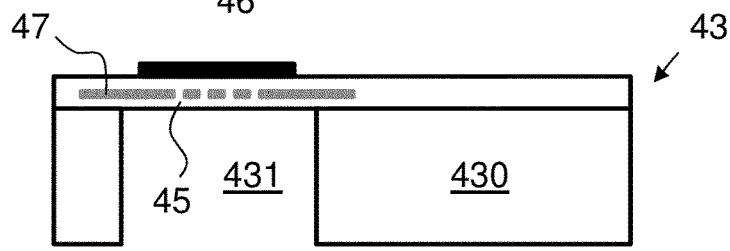
FIG. 7 shows a schematic cross-sectional view of an embodiment of yet another detector chip.

FIG. 7 shows yet another embodiment of the sensor chip 43, wherein, instead of the thermocouples 46, a resistive wire 47 is arranged in order to detect a rising temperature due to absorption of radiation in the absorber layer 450.

Figure 8:
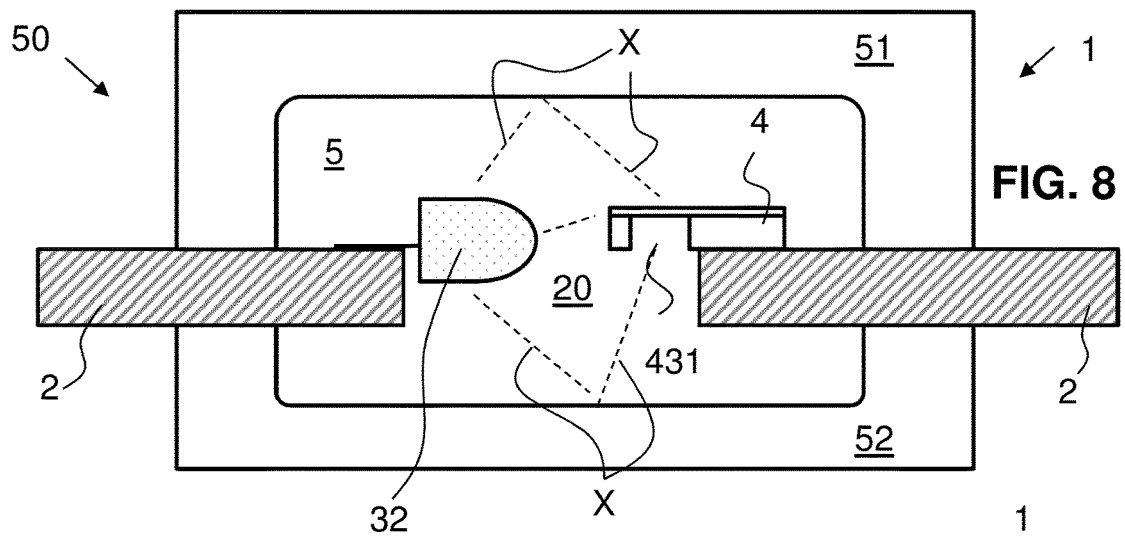
FIG. 8 shows a schematic and simplified cross-sectional view through the embodiment of the gas sensor module according to FIG. 4.

FIG. 8 shows a cross-sectional view through an embodiment of the gas sensor module 1. In this case, the board 2 is provided with the recess 20, as described above, wherein a light bulb 32 is arranged within the recess 20, on the lateral face of the board 2. The capsule 50 is arranged such as to close the recess 20 and covering the radiation source 32 and the detector unit 4. The capsule 50 delimits the radiation cell 5 and is composed of the two constituents 51 and 52, as described above. It may well be seen that the detector unit 4 is arranged in an overhanging manner such that it's sensitive area is placed over the recess 20 may be accessible to radiation sides (top and bottom). Accordingly, radiation may arrive on the detector unit 4 from the lower half defined by 52 and the top half defined by 51 of the radiation cell 5. Both half shells 51, 52 are curved out. It is, however, also conceivable that at least the second half shell 52 is flat as in the embodiment according to FIG. 9.

Generally, the concave shape of the half shell 51, 52 may provide space for the accommodation of building parts such as the radiation source 3 and the detector unit 4. It may also be provided in a shape that serves for reflection purposes such that, for example, as many radiation paths X as possible are focused onto the detector unit 4. Thereby, the space in the capsule 50 that is filled with the test gas may be efficiently tested.

Figure 9:
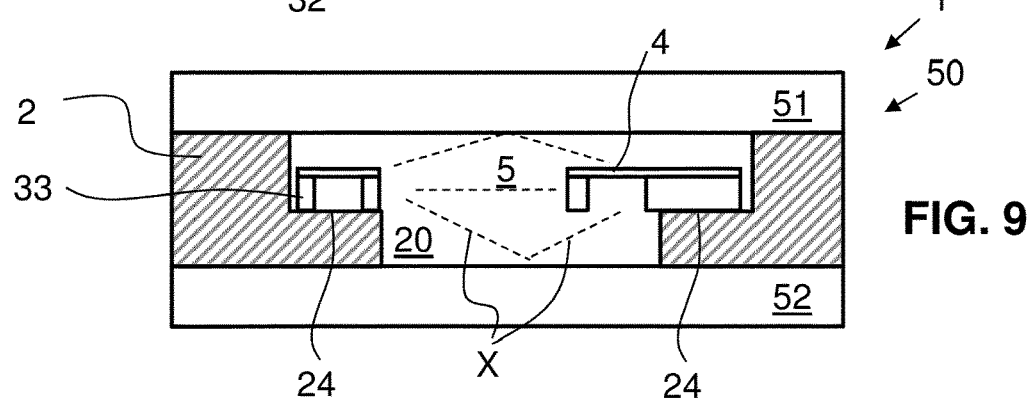
FIG. 9 shows a cross-sectional view of a further embodiment of the gas sensor module

FIG. 9 shows a cross-sectional view of yet another embodiment of the gas sensor module 1, wherein the board 2 is provided, on its lateral face, with as step 24. Both the radiation source 33 and the detector unit 4 are arranged on this step 24 and therefore are arranged completely within the recess 20. The capsule 50 is formed by the plate-like constituents 51 and 52. Accordingly, a particularly flat design is achieved through the embodiment according to FIG. 9. Alternatively, a plate-like constituents 51, 52 may also be placed in the board on the same step 24 or an alternative step (not shown).

In the FIGS. 9 to 16, some exemplary radiation paths X are shown in dashed lines. Some are direct paths X, some involve one reelection. Of course, multi-reflection paths X are also possible. The shape of the shells 51, 52 may be adapted to the specific arrangement of the radiation source 3 and the detector unit 4.

Figure 10:
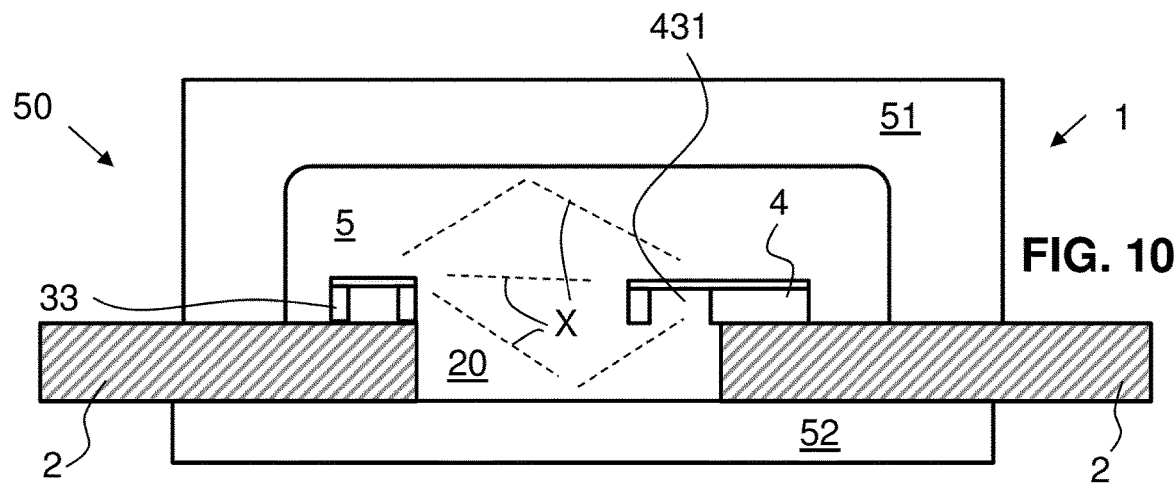
FIGS. 10, 11, 12, 13, 14, 15, and 16 show further embodiments of the gas sensor module according to invention with different arrangement of the radiation source and/or the detector unit.

FIG. 10 shows a cross-sectional view of a further embodiment of the gas sensor module 1, wherein the first half shell 51 is curved out, i.e. it is concave, to provide, in its concave shape, a part of the radiation cell 5, as do the shells 51, 52 in the embodiment according to FIG. 8. Both, the radiation source 3 (here, as an example, the MEMS hotplate 33 is shown) and the detector unit 4 are provided on the first side 21 of the board 2 and do not extend into the recess 20. Radiation paths X may be propagating through the recess 20 as indicated by the dashed line. The detector unit 4 is mounted in an overhanging manner such that the detector unit 4 may receive and detect light from both sides, from its top and bottom side.

Figure 11:
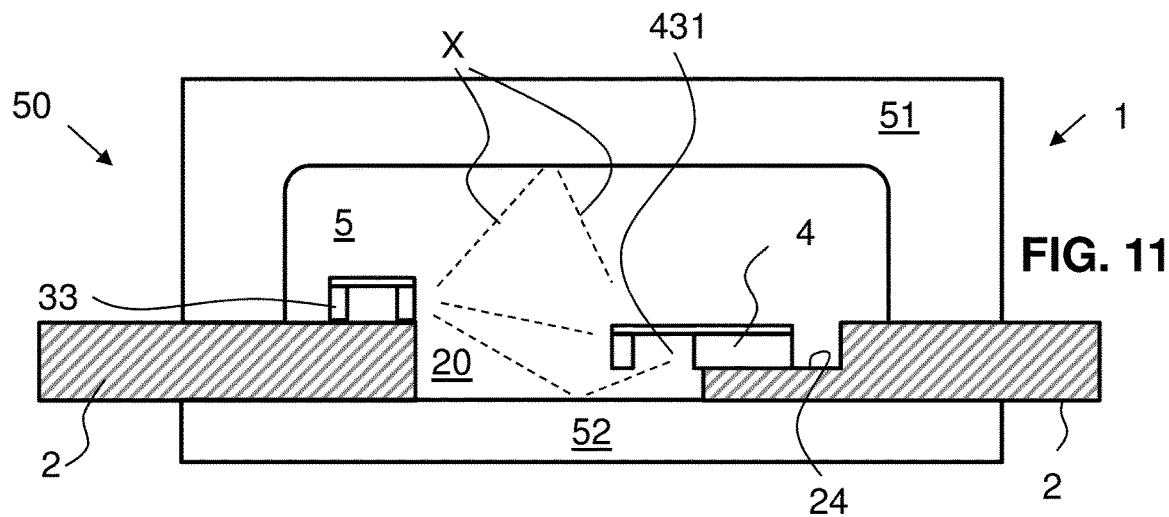

FIG. 11 shows a cross-sectional the same embodiment of the gas sensor module 1 as FIG. 10 with the difference that the detector unit 4 is lowered onto a step 24 into the recess 20.

Figure 12:
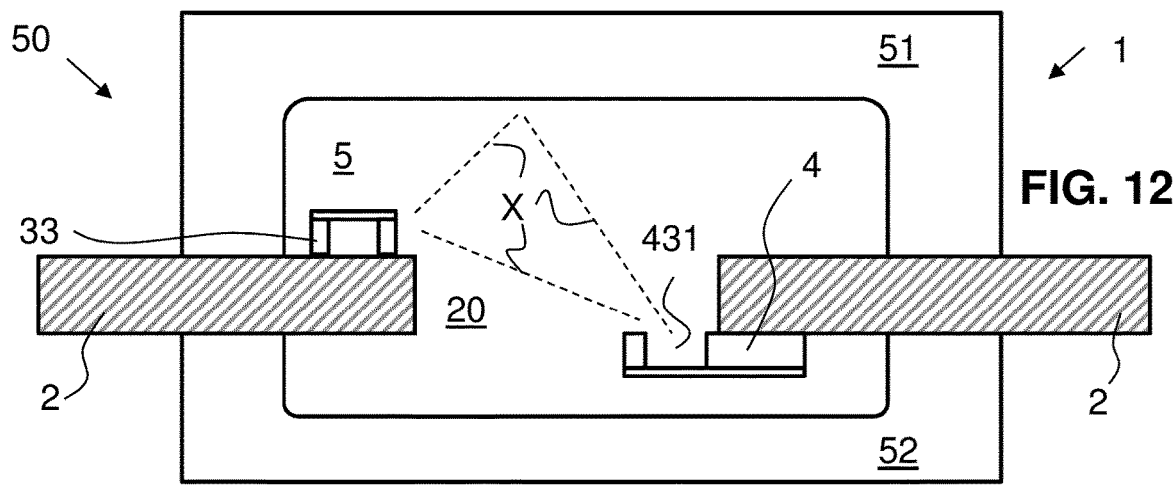

FIG. 12 shows the embodiment of FIG. 8 with the difference that the radiation source 3 is arranged on the first side 21 while the detector unit 4 is arranged in an overhanging manner on the second side 22 of the board 2.

Figure 13:
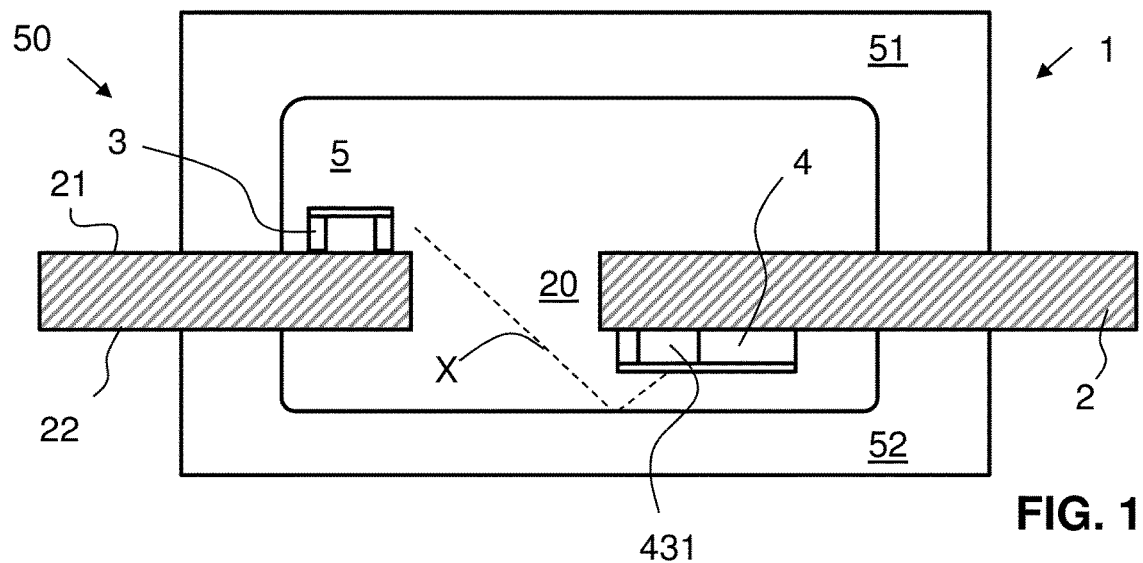

FIG. 13 shows the embodiment of FIG. 12 with the difference that the detector unit 4 is not arranged in an overhanging manner but placed at distance to the lateral edge face delimiting the recess 20.

Figure 14:
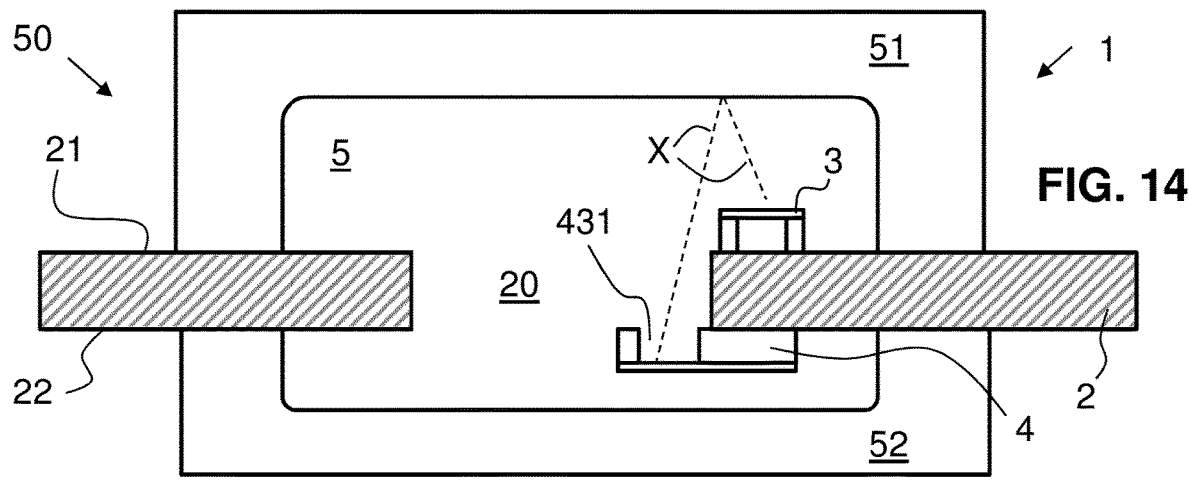

FIG. 14 shows the embodiment of FIG. 12 with the difference that the radiation source 3 is arranged directly opposite the detector unit 4, i.e. on the same side of the recess 20.

Figure 15:
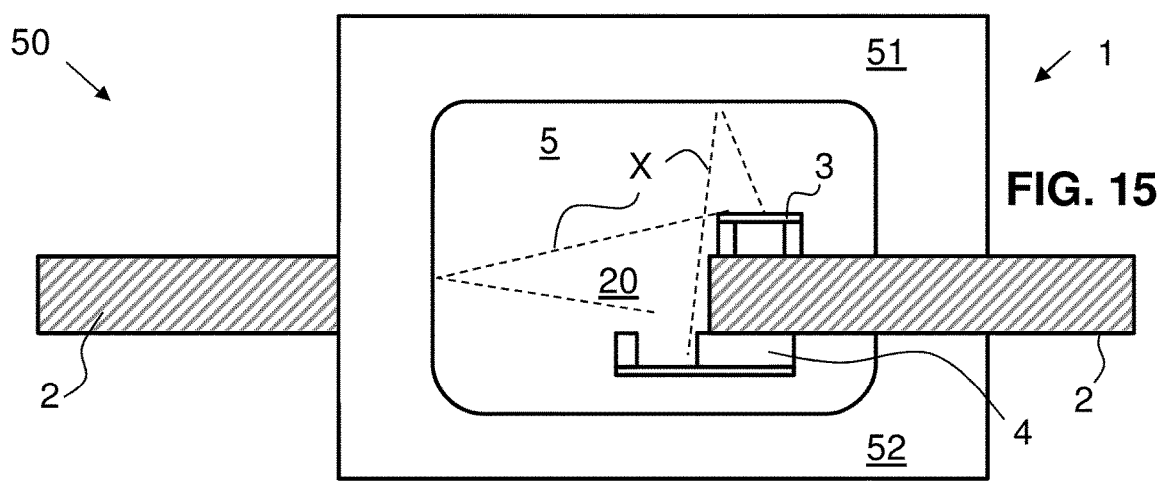

FIG. 15 shows the embodiment according to FIG. 14 with the difference that the radiation capsule 50 is extending through the recess 20, which optimizes the reflection.

Figure 16:
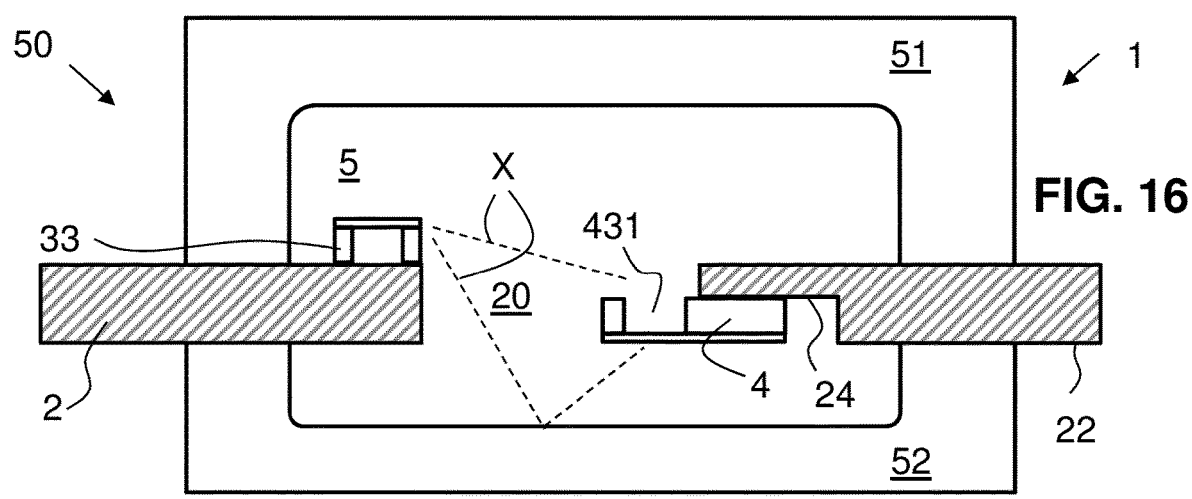

FIG. 16 shows the embodiment according to FIG. 12 with the difference that the step 24 at the later edge face is provided on the second side 22 of the board 2.

It is to be understood that the different arrangements of the detector unit 4 and the radiation source 3 may be combined differently among these embodiments according to the Figures.

It is also to be understood that, where the MEMS hotplate 33 is shown, a different radiation source 3, as outlined herein, may be used.

Also, in any arrangement, one or both of the radiation source 3 and the detector unit 4 may be mounted in an overhanging mount and/or on a step 24 from the first or the second side 21, 22 and/or at the lateral edge face delimiting the recess 20 in the direction of the first and second sides 21, 22 or at distance to said lateral edge face.

Also, it is conceivable that more than one radiation source 3 and more than one detector unit 4 may be arranged on the board 2, for example, by combining the embodiments as described herein.

| LIST OF REFERENCE SIGNS | |
|---|---|
| 1 | gas sensor module |
| 2 | board |
| 20 | recess in 2 |
| 21 | first side of 2 |
| 22 | second side of 2 |
| 23 | lateral inner face 20 |
| 24 | step in 2 |
| 3 | radiation source |
| 31 | source holder |
| 32 | light bulb |
| 33 | MEMS hotplate |
| 4 | radiation detector unit |
| 40 | detector plane |
| 41 | first radiation detector |
| 42 | second radiation detector |
| 43 | sensor chip |
| 430 | silicon substrate of 43 |
| 431 | opening in 430 |
| 44 | radiation sensor |
| 45 | membrane |
| 450 | absorber layer |
| 46 | thermocouple |
| 47 | resistive wire |
| 5 | radiation cell |
| 50 | radiation capsule |
| 500 | inner surface of 50 |
| 501 | radiation source chamber for 3 |
| 51 | first shell of 50 |
| 511 | second containment part for 3 |
| 512 | third containment part for $C_1$ |
| 513 | fourth containment part for C2 |
| 514 | snap-in hook |
| 515 | first containment part for 31 |
| 516 | fifth containment part for 62 |
| 517 | sixth containment part for 43 and 61 |
| 52 | second shell of 50 |
| 524 | snap-in recess |
| 6 | radiation filter arrangement |
| 60 | filter plane |
| 61 | filter element |
| 62 | filter holder |
| 63 | recess for inserting 43 |
| 64 | recess in 52 for 43 |
| 7 | access opening |
| 71 | venting medium |
| 8 | microprocessor |
| $C_1$, $C_2$ | radiation channel |
| L | longitudinal axis of 3 |
| X | radiation path |

The invention claimed is:

1. A gas sensor module integrated onto or including a board, such as a printed circuit board, the gas sensor module comprising:
at least one radiation source configured for emitting radiation;
at least one radiation detector unit configured to detect at least part of said radiation and comprising a sensor chip with a thermal infrared sensor;
a radiation cell providing at least one radiation path from said radiation source to said radiation detector unit;
wherein said board is provided with a recess and has a first side and an opposing second side, the recess forming a through-opening or a cut-out through the board,
and wherein said gas sensor module is configured such that at least part of said at least one radiation path is propagating through or into said recess, said at least one radiation path being propagating on at least one of the first side or the second side of the board,
wherein the thermal infrared sensor is suspended on a membrane spanning the through-opening or the cut-out through the substrate of the sensor chip, and the infrared-sensitive region of the sensor chip protrudes over an internal edge of the board into said recess in such a way that radiation incident from the first side or the second side of the board is measurable by the sensor chip.

2. The gas sensor module according to claim 1, wherein said at least one radiation source and said at least one detector unit are arranged on the same side of said first and second sides or are arranged on opposing sides of said first and second sides of the board.

3. The gas sensor module according to claim 1, wherein said at least one radiation source and/or said at least one detector unit is/are arranged, at least in part or entirely, within said recess.

4. The gas sensor module according to claim 1, wherein said radiation cell is delimited by a radiation capsule;
wherein said radiation capsule encapsulates said at least one radiation path;
and wherein said radiation capsule is configured to reflect at least part of said radiation toward said at least one radiation detector unit.

5. The gas sensor module according to claim 4, wherein said radiation capsule is formed by one or more first and second shells;
wherein said first and second shells are provided with an inner surface, said inner surface delimiting, at least in part, said radiation cell and being configured to reflect at least part of said radiation toward said at least one radiation detector unit.

6. The gas sensor module according to claim 5, wherein said radiation capsule is formed by a single first shell and a single second shell, wherein said single first and second shells are shaped to have a mirror-inverted design.

7. The gas sensor module according to claim 5, wherein said first and second shells are made from metal or comprise at least in part metallized inner surfaces; or
Wherein said first and second shells are made from plastic and coated with a metallic coating on said first and second inner surface for maximizing infrared reflectivity.

8. The gas sensor module according to claim 4, wherein said radiation capsule is at least partly immersed into said recess.

9. The gas sensor module according to claim 4, wherein said radiation source and said at least one detector unit are arranged on the same side of said first and second sides or are arranged on opposing sides of said first and second sides of the board;
wherein said radiation cell is designed and said at least one radiation source and said at least one radiation detector unit are configured and arranged such as to establish at least one radiation path on said first and second sides of the board, whereby radiation emitted by said at least one radiation source is detectable from both first and second sides of the board.

10. The gas sensor module according to claim 4, wherein a radiation filter arrangement is placed in one or more of said at least one radiation path leading to the respective detector unit, the radiation filter arrangement being a narrowband filter that allows transmission of radiation within a wavelength range selected according to the gas to be measured while it blocks transmission in other wavelength ranges; and wherein said radiation filter arrangement is designed to have a filter plane and the at least one detector unit is designed to have a detector plane, and wherein said radiation filter arrangement and the at least one detector unit associated to one another are disposed such that the filter plane and the detector plane are oriented at substantially right angles to one another; or wherein the radiation capsule is designed to focus the radiation onto the radiation detector unit.

11. The gas sensor module according to claim 1, wherein said at least one radiation source is a light source is selected from the group consisting of a broadband light source, an infrared light source, an incandescent light bulb, a LED, a MEMS hotplate, or a laser.

12. The gas sensor module according to claim 11, wherein said at least one radiation source is mounted in a holder or by clamping, by gluing, by soldering or by thermoplastic or ultrasonic staking.

13. The gas sensor module according to claim 1, wherein a radiation filter arrangement is placed in one or more of said at least one radiation path leading to the respective detector unit.

14. The gas sensor module according to claim 13, wherein the at least one radiation detector unit is a broadband detector unit; or wherein said radiation filter arrangement is a narrowband filter arrangement that allows transmission of radiation within a wavelength range selected according to the gas to be measured while it blocks transmission in other wavelength ranges.

15. The gas sensor module according to claim 13, wherein said radiation filter arrangement and the at least one detector unit associated to one another are individual units that are spaced apart from one another by at least 1 millimeter to 10 millimeters.

16. The gas sensor module according to claim 1, wherein no radiation filter arrangement is arranged in said at least one radiation path.

17. The gas sensor module according to claim 1, wherein a radiation filter function is integrated onto the detector unit or onto said radiation source.

18. The gas sensor module according to claim 17, wherein radiation filter function is integrated by means of metamaterial perfect absorbers; or wherein the radiation filter function provides a narrowband filter that allows transmission of radiation within a wavelength range selected according to the gas to be measured while it blocks transmission in other wavelength ranges.

19. The gas sensor module according to claim 1, comprising a radiation detector unit with two or more detectors, the detectors being arranged in a spaced manner to one another, thereby realising a multi radiation channel gas sensor module.

20. The gas sensor module according to claim 19, wherein said radiation channels are disposed such as to extend generally radially outwardly from the same at least one radiation source; or wherein a radiation filter arrangement is placed in one or more of said at least one radiation path leading to the respective detector unit, the radiation filter arrangement comprises a filter element in one or in each radiation channel; or wherein at least one of said radiation channels is configured as a reference radiation channel.

21. The gas sensor module according to claim 19, wherein said radiation cell is delimited by a radiation capsule being provided with at least one or more access openings for gas exchange with an environment, and wherein at least one of i) the at least one or more access openings are arranged in the region of the radiation source away from the at least one radiation detector unit or ii) at least one access opening is covered, at least in part, with a venting medium.

22. The gas sensor module according to claim 1, wherein said radiation capsule is provided with at least one or more access openings for gas exchange with an environment.

23. The gas sensor module according to claim 1, wherein the gas sensor module is configured for ascertaining a gas concentration in a test medium.

24. The gas sensor module according to claim 1, wherein the first and second shells or the first shell and the board are connected to one another by means of staking, in particular by ultrasonic staking.

25. A gas sensor module including a board, such as a printed circuit board, and comprising:

at least one radiation source configured for emitting radiation;

at least one radiation detector unit configured to detect at least part of said radiation and comprising a sensor chip with a thermal infrared sensor suspended on a membrane, the latter spanning a recess forming a through-opening or a cut-out through the substrate of the sensor chip;

a radiation cell providing at least one radiation path from said radiation source to said radiation detector unit, wherein said gas sensor module is configured such that at least part of said at least one radiation path is propagating through or into said recess, and wherein the infrared-sensitive region of the sensor chip protrudes over an internal edge of the board into said recess in such a way that the membrane can be optically accessed from a top and a bottom of the board.

* * * * *